United States Patent [19]

Harper

[11] Patent Number: 5,423,653
[45] Date of Patent: Jun. 13, 1995

[54] DISC-TRANSPORTING MANDREL

[75] Inventor: Bruce M. Harper, San Jose, Calif.

[73] Assignee: HMT Technology Corporation, Fremont, Calif.

[21] Appl. No.: 163,926

[22] Filed: Dec. 8, 1993

[51] Int. Cl.6 .............................................. B65G 49/07
[52] U.S. Cl. ...................... 414/680; 294/158; 414/908; 414/910; 414/937
[58] Field of Search ................ 294/158; 414/404, 416, 414/908, 910, 937

[56] References Cited

U.S. PATENT DOCUMENTS

| | | | |
|---|---|---|---|
| 4,290,734 | 9/1981 | Van Breen | 414/786 |
| 4,645,401 | 2/1987 | Hopkins et al. | 414/222 |
| 4,735,540 | 4/1988 | Allen et al. | 414/222 |
| 4,787,806 | 11/1988 | Aupperle | 414/416 |
| 4,806,057 | 2/1989 | Cay et al. | 414/225 |
| 4,865,509 | 9/1989 | Carlton | 414/416 |
| 4,957,406 | 9/1990 | Akagawa | 414/416 |
| 4,958,873 | 9/1990 | Akagawa | 294/158 X |
| 5,131,800 | 7/1992 | Akagawa | 414/416 |
| 5,217,340 | 6/1993 | Harada et al. | 414/172 |
| 5,259,719 | 11/1993 | Akagawa | 414/908 X |

*Primary Examiner*—Michael S. Huppert
*Assistant Examiner*—Janice L. Krizek
*Attorney, Agent, or Firm*—Peter J. Dehlinger

[57] ABSTRACT

A mandrel for transporting a plurality of magnetic discs is described. The mandrel has a series of axially spaced grooves, each designed to engage and support a magnetic disc at an inner edge region of the disc's circular opening, at two or more contact positions.

12 Claims, 2 Drawing Sheets

DISC-TRANSPORTING MANDREL

FIELD OF THE INVENTION

The present invention relates to a mandrel for handling magnetic recording discs or media.

BACKGROUND OF THE INVENTION

Rigid magnetic recording media are used for recording and retrieving digital data in computer disc drive devices. During fabrication of thin-film magnetic recording discs, hereinafter magnetic discs or discs, there are two important handling requirements that must be met in fabricating high quality discs. First, the work area must be free of contaminants, such as dust and other air-borne particles; second, the discs must be protected from physical damage that may occur as the discs are being handled.

Typically, the fabrication of the magnetic discs is done is a clean room, where the level of contamination is kept very low. The discs may be kept under laminar flow hoods during much of the processing, and handling and exposure to human operators is minimized.

Fabricating magnetic discs involves many steps: unloading the disc substrates from a carrier cartridge, placing the substrates into a flow-through sputtering pallet which is oriented in a vertical plane and contains numerous disc holding grooves, where thin-film layers forming the recording medium are deposited on the substrate, transferring the discs from the film-deposition apparatus to one or more stations where the disc surfaces are lubricated, and then packaged for shipment. It is essential during the disc-handling steps, that the disc surfaces be protected from any surface damage. A variety of disc-handling devices, such as mandrels, have been proposed or developed for use in transferring individual discs or groups of discs. See, for example, U.S. Pat. Nos. 4,865,509; 4,290,734; 4,957,406; 4,787,806; 4,735,540; 4,645,401; and 5,131,800. Many of these devices involve moving parts, which introduce the possibility of mechanical breakdown and abrasion of the disc surfaces due to moving parts. Other devices which have a unitary construction may have difficulty in handling discs without damage, due to thickness and/or radial-dimension variations among discs, or variations in the spacing between adjacent discs.

SUMMARY OF THE INVENTION

In one aspect, the invention includes a mandrel for transferring a plurality of axially aligned magnetic discs, where each disc has a circular opening defining an inner edge. The mandrel includes an elongate bar having a disc-support region designed to be inserted into the circular openings of the magnetic discs, with such in an aligned configuration.

Spaced axially along the disc-support region of the elongate bar is a plurality of grooves. Each groove is defined by (i) a pair of confronting sidewalls and (ii) a base. One sidewall has a face extending perpendicular to the long axis of the elongate bar. The base of the groove has a surface whose radius of curvature is such as to support an inner edge region of a disc by contact with the inner edge region at two or more points.

The sidewalls and the base of the mandrel are constructed to support the disc, with an inner edge region of the disc supported against the sidewall extending perpendicular to the long axis of the bar. In one embodiment, the other sidewall is spaced from the first sidewall a distance which just accommodates the thickness of the disc. Alternatively, or in addition, the base is sloped to urge the disc against the face of the perpendicular sidewall.

A group of magnetic discs may have a measurable variation in their radii of curvature of their inner edges. Preferably, the radius of curvature of the base surface of the groove is at least as great as the largest radius of curvature in any group of discs. Additionally, each disc in the group has a thickness within a defined tolerance, and the confronting sidewalls of groove are spaced to accommodate each disc.

Also in a preferred embodiment, the sidewalls forming each groove are chamfered at their outer edges. The chamfer functions to guide discs which are axially misaligned with an associated groove into that groove. Also in a preferred embodiment, the invention includes a sensing system, including light-producing and light-receiving fiber elements, running through the mandrel bar. The sensing system is used to inspect the environment near the distal-end of the mandrel by detecting light-reflecting objects. For example, the sensing system is used to detect the presence of a magnetic disc placed before the mandrel, as the discs are transferred from or placed into a supporting structure, such as a pallet, cassette, or the like.

In still another aspect, the invention includes a robotic mandrel for automatically moving a plurality of magnetic discs from one disc-holding station to another. The apparatus includes a robotic arm which can be moved between such disc-holding stations. Carried on this arm in a substantially horizontal position, is a mandrel of the type described above.

These and other objects and features of the invention will be more fully appreciated when the following detailed description of the invention is read in conjunction with the accompanying drawings.

DETAILED DESCRIPTION OF THE INVENTION

The present invention is designed for transporting, e.g., between various work stations, a plurality of discs, such as thin-film magnetic recording discs of the type intended for use in computer hard drives.

Figure 1:
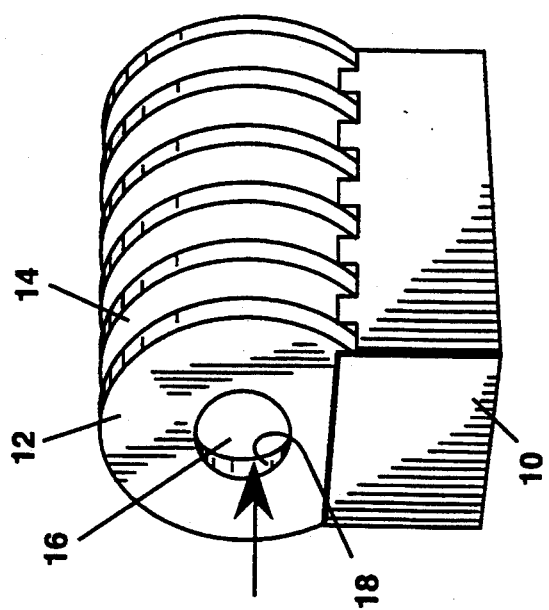
FIG. 1 is an illustration of a disc-transporting mandrel constructed in accordance with the invention and held on a robotic arm for engaging a group of magnetic discs held in a carrier cartridge.

FIG. 1 shows at 10 a cassette which carries a plurality of magnetic recording discs, such as discs 12, 14. Disc 12, which is representative, has a circular opening 16 for engaging a disc drive mechanism, and which in the present invention is used in transporting the disc between work stations. The inner opening is defined by an inner edge 18. One standard-size disc has an inner diameter (the diameter of the circular opening) of radius 0.494 inches and an outer diameter of radius 1.870 inches. Another standard-size disc has an inner diameter of radius 0.2374 inches and an outer diameter of radius 0.940 inches.

The discs are manufactured to a defined tolerance, both in disc thickness and inner diameter. Typically, the tolerance, i.e., range of variation among a group of discs, is within 0.001 inch (1 mil) for the inner diameter, and 0.002 inch (2 mil) for disc thickness. The magnetic discs are carried in the cassette such that the circular openings are axially aligned, meaning their rotational axes are along a common line.

Also shown in FIG. 1 is a robotic apparatus 20 for use in automatically moving a plurality of magnetic discs, such as discs 12, 14, from a first to a second workstation. The apparatus includes a robotic arm 22 which is moveable between various angled, horizontally disposed positions, such as indicated by the dashed line positions in the figure. The arm itself is attached to a robotic carrier device (not shown) in apparatus 20 which carries the arm between various workstations.

Carried on the arm is a disc-transporting mandrel 24 constructed in accordance with the invention, and described below. The mandrel is designed to engage a plurality of discs, such as those in the cassette 10, by insertion of the mandrel into the openings of the aligned discs, and seating of the discs on grooves in the mandrel, when the mandrel is raised, as will be described below.

Figure 2B:
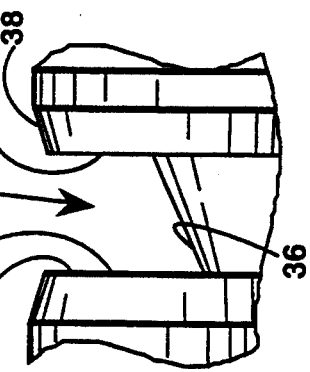
FIG. 2B shows, in enlarged view, a portion of a mandrel groove in the region of FIG. 2A.
Figure 2A:
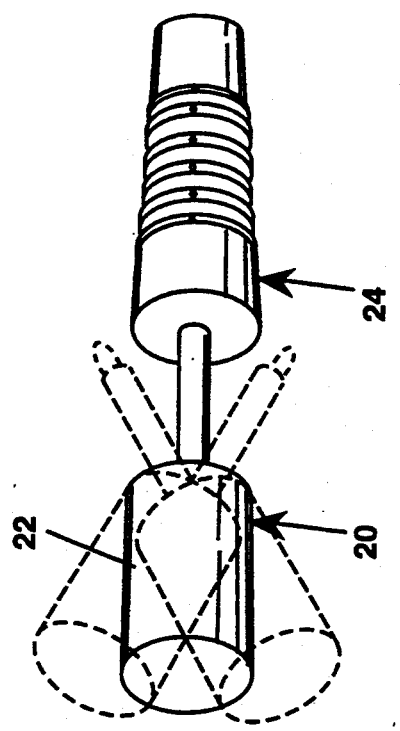
FIG. 2A shows a side view of the mandrel in FIG. 1, constructed in accordance with the invention.

FIG. 2A shows a side view of the mandrel. As seen in the figure, the mandrel includes an elongate bar 26 having a proximal end 26a adapted for attachment to a robotic arm and the other end, a distal disc-support region 26b extending from this end. Formed on the support region is a plurality of grooves, such as grooves 28, 30, which are constructed, in accordance with the invention, for engaging and supporting discs at defined, spaced positions along the mandrel.

The construction of the mandrel grooves will be described with reference particularly to FIG. 2B, which shows in enlarged view the mandrel structure forming groove 28. The groove, which is representative, is formed of a pair of confronting side walls 32, 34 which, in the present embodiment, are spaced from one another a distance which just accommodates the thickness of a disc to be supported in the groove. At least one of the sidewalls, in this case sidewall 32, has a face, such as face 32a, disposed perpendicular to the long axis of the mandrel, providing a disc-support surface against which a disc in the groove is supported when the disc is seated in the groove, again as will be described below.

Figure 4:
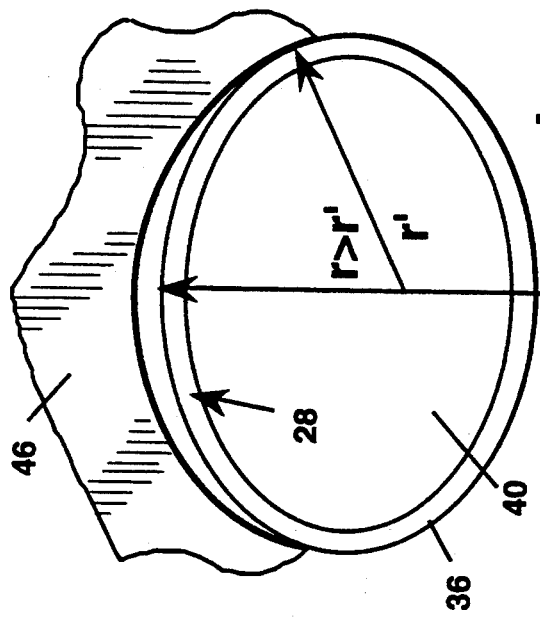
FIG. 4 illustrates the radius-of-curvature features of a disc-support surface and an inner-diameter region of a disc supported in a groove in the mandrel.

A base 36 in the groove defines a surface which is designed to support a disc held in the groove by contact between the base and an inner edge region of the disc, as will be described further with respect to FIG. 4. The sidewalls and base in the groove are constructed to support a disc seated in the groove with an inner edge region of the disc supported against the sidewall face that is perpendicular to the mandrel's long axis.

In the present embodiment, the base is sloped, as seen in FIG. 2B, to place the disc in the groove such that an inner edge region of the disc is supported against face 32a of sidewall 32. It will also be appreciated that the close spacing between the sidewalls forming the groove acts to place the disc in the groove such that the inner edge region of the disc is supported against face 32a in groove 28, since the spacing between the sidewalls just accommodates the disc thickness. The invention contemplates a mandrel in which the groove construction that is effective to place a disc in the groove such that an inner edge region of the disc is supported against one face of the sidewall may be the sloped base surface and/or the spacing between confronting sidewalls forming a groove.

Also as seen in FIG. 2B, the sidewalls forming groove 28 are chamfered at their outer edges to guide a disc into the groove, as will be described. As seen best in FIG. 3, the chamfered surface, such as surface 38 in sidewall 34, is an elliptical conical section defining a sloped outer edge region of the sidewall. The chamfer angle, measured from the horizontal, is preferably between about 20°–40°.

Figure 3:
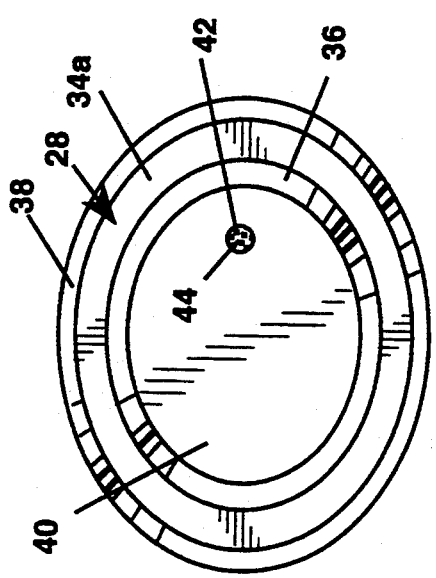
FIG. 3 is an enlarged end view of a mandrel of FIG. 2A, taken along section 3—3 in FIG. 2A.

The mandrel is seen in cross-section, through a view line 3—3 in FIG. 2A, in FIG. 3. The figure shows an elliptical core 40 in the mandrel, the elliptical sloped base which supports a disc, the perpendicular face, indicated at 34a, of sidewall 34 and chamfered elliptical sloped surface 38 defining the outer edge region of the sidewall.

Also seen in FIG. 3 is a channel 42 extending through the mandrel bar, parallel to the long axis of the mandrel. The channel holds a light fiber 44 that is used for inspecting the environment in front of the mandrel. This feature is useful in detecting the presence of a disc before or after transfer from one workstation to the next.

According to an important feature of the invention, the core and surrounding groove base surfaces in the mandrel (see FIGS. 2B and 3) are designed to support a disc by contact between the base and the inner edge of the disc, where the base contact surface has a radius of curvature which permits the base to contact the inner edge of the disc with at least two points of contact. This feature is illustrated in FIG. 4, which shows core 40 and surrounding base 36 in groove 28, and an inner edge portion of a disc 46 seated in the groove. In this figure, the radius of curvature of base 36 is indicated at r, and is the radius of curvature of the intersection of base 36 with sidewall 32. The radius of curvature of the disc opening is likewise indicated at r'.

Because $r \geq r'$, the inner edge of the disc necessarily makes contact with at least two points on base 36, as can be appreciated in the figure. This can be seen by imagining the base to have a radius of curvature much less than that of the disc, where the disc would rest on the base at a single contact point. As the radius of curvature of the base is increased, the base will at some point make full-surface contact with the disc's inner edge. As the radius of curvature of the base is increased still further ($r > r'$ in FIG. 4), the disc will be supported by two points of contact with the base.

In the embodiment shown, the radius of curvature just matches that of a disc having a greatest radius of curvature within the tolerance mentioned above. For discs having slightly smaller radii of curvature, the base would have a slightly larger radius of curvature. The two-point contact provided by this feature acts to stabilize the seating of the disc in its groove during transport.

The mandrel as shown in the figures, particularly FIG. 2A, is depicted having five grooves. It will be appreciated that the mandrel can be constructed to contain any number of grooves desired. Similarly, the grooves can be placed on either one or both sides of the elongate bar.

Figure 2A:
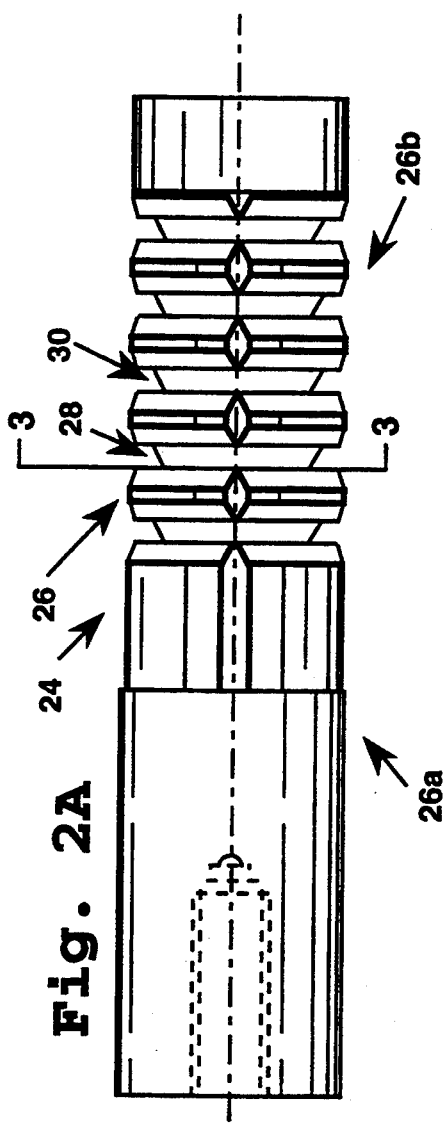
Figure 5:
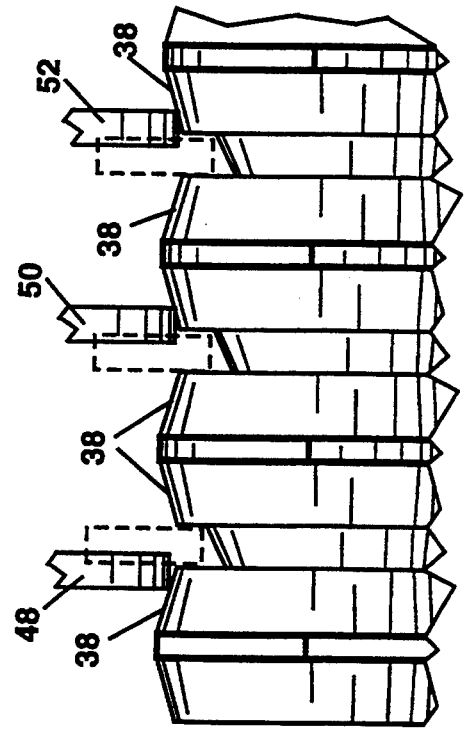
FIG. 5 illustrates how the mandrel functions to engage and support a plurality of axially aligned discs.

FIG. 5 shows how the mandrel operates to pick up a plurality of discs, such as discs held at a workstation, such as shown in FIG. 2. Initially, the mandrel is inserted through the openings of a group of aligned discs, until the mandrel grooves are aligned longitudinally with associated discs. As shown in the figure, and according to an advantage of the chamfer construction in the mandrel, the discs may be supported at positions (shown in solid lines) that are off alignment with the grooves by as much as several mm.

To seat the discs in the mandrel grooves, the mandrel is raised, initially bringing the chamfered groove surfaces into contact with the upper inner edge surfaces of the discs (solid lines), as shown in FIG. 5. As the mandrel is raised further, to lift the discs off their support, the chamfered surfaces now act to urge the discs toward the corresponding groove, as indicated by dashed lines in the figure.

As the discs seat in their grooves, each disc is further biased toward the sidewall by the sloped base surface in each groove. In the embodiment shown, there is close tolerance between the confronting sidewalls, and this feature helps maintain the discs in position in each groove. The inner edge surface of each disc is supported against the perpendicular surface of the groove sidewalls, effectively preventing the discs from rocking on their inner edge surfaces.

At the same time, the two-point contact (FIG. 4) between the base of the groove and the disc acts to prevent both rotational disc movement and rocking movement when the discs are in a seated position. The discs can then be transported with little risk of contact between adjacent discs and of damage due to relative movement between the mandrel and the discs.

At the next workstation, the mandrel is then lowered until the discs contact a supporting seat in a fixed structure, releasing the discs from the grooves. The mandrel is then withdrawn from the circular openings of the discs.

The disc-transporting mandrel described herein is a unitary structure, constructed with no moving parts. The discs can seat snugly in the grooves of the mandrel, even when the discs are not longitudinally aligned with an associated groove. The two-point contact between the base surface of a groove and the disc holds the discs firmly with little risk of rocking and rotational motion during transport. The mandrel can be designed to accommodate groups of discs with a given tolerance in thickness or in radius of curvature.

Although the invention has been described with respect to particular embodiments, it will be apparent to those skilled in the art that various changes and modifications can be made without departing from the invention.

It is claimed:

1. A mandrel for transferring a plurality of magnetic discs, each having a circular opening defining an inner edge, comprising:

an elongate bar having a disc-support region designed to be inserted into the circular openings of a plurality of said magnetic discs, said bar having a long axis; and a plurality of grooves spaced axially along said disc-support region, each groove being formed by means defining (i) a pair of confronting sidewalls, at least one of which has a face extending perpendicular to the long axis of said bar, and (ii) a base that is sloped to urge the disc against said face, said base having a surface which is adapted to support the disc by contact between the base and the inner edge of the disc, said surface having a radius of curvature which permits the base to contact the inner edge of the disc with at least two contact points when the disc is supported in the groove, said sidewalls and base being constructed to support the disc with an inner edge region of the disc supported against said face.

2. The mandrel of claim 1, wherein the discs to be transferred each have a thickness within a defined tolerance and the other confronting sidewall is spaced from the one sidewall a distance which just accommodates the thickness of each disc held in the associated groove.

3. The mandrel of claim 1, wherein the discs to be transferred have inner-edge radii of curvature within a defined tolerance and the radius of curvature of each base in the mandrel is at least as great as the largest radius of curvature in the plurality of discs.

4. A robotic apparatus for automatically moving a plurality of magnetic discs between first and second disc-holding stations, where each disc has a circular opening defining an inner edge, said apparatus comprising:

a robotic arm which can be moved between said first and second stations; and carried on said arm, in a substantially horizontal position, a mandrel having an elongate bar having a disc-support region designed to be inserted into the circular openings of a plurality of magnetic discs, said bar having a long axis; and a plurality of grooves spaced axially along said disc-support region, each groove being formed by means defining (i) a pair of confronting sidewalls, at least one of which has a face extending perpendicular to the long axis of said bar, and (ii) a base that is sloped to urge the disc against said face, said base having a surface which is adapted to support the disc by contact between the base and the inner edge of the disc, said surface having a radius of curvature which permits the base to contact the inner edge of the disc with at least two contact points when the disc is supported in the groove, said sidewalls and base being constructed to support the disc with an inner edge region of the disc supported against said face.

5. The apparatus of claim 4, wherein each disc of the plurality of discs to be transferred has an inner edge which has a radius of curvature within a defined tolerance and the radius of curvature of each base is at least as great as the largest radius of curvature in the plurality of discs.

6. A mandrel for transferring a plurality of magnetic discs, each having a circular opening defining an inner edge, comprising:

an elongate bar having a disc-support region designed to be inserted into the circular openings of a plurality of said magnetic discs, said bar having a long axis; and a plurality of grooves spaced axially along said disc-support region, each groove being formed by means defining (i) a pair of confronting sidewalls, at least one of which has a face extending perpendicular to the long axis of said bar, said sidewalls being chamfered at their outer edges to urge a disc, when said disc is axially offset from an associated groove, into said groove, and (ii) a base having a surface which is adapted to support the disc by contact between the base and the inner edge of the disc, said surface having a radius of curvature which permits the base to contact the inner edge of the disc with at least two contact points when the disc is supported in the groove, said sidewalls and base being constructed to support the disc with an inner edge region of the disc supported against said face.

7. The mandrel of claim 6 having said grooves on the top and bottom surfaces of said bar.

8. The mandrel of claim 6, which further includes a sensing system, including light-producing and light-receiving fiber elements, extending through said bar for detecting light-reflecting objects near the mandrel along the axis thereof.

9. The mandrel of claim 6, wherein the discs to be transferred each have an inner edge which has a radius of curvature within a defined tolerance and the radius of curvature of each base is at least as great as the largest radius of curvature in the plurality of discs.

10. The mandrel of claim 6, wherein the other confronting sidewall is spaced from the one sidewall a distance which just accommodates the thickness of each disc held in the associated groove.

11. A robotic apparatus for automatically moving a plurality of magnetic discs between first and second disc-holding stations, where each disc has a circular opening defining an inner edge, said apparatus comprising:

a robotic arm which can be moved between said first and second stations; and carried on said arm, in a substantially horizontal position, a mandrel having an elongate bar having a disc-support region designed to be inserted into the circular openings of a plurality of magnetic discs, said bar having a long axis; and a plurality of grooves spaced axially along said disc-support region, each groove being formed by means defining (i) a pair of confronting sidewalls, at least one of which has a face extending perpendicular to the long axis of said bar, said sidewalls being chamfered at their outer edges to urge a disc, when said disc is axially offset from an associated groove, into said groove, and (ii) a base having a surface which is adapted to support the disc by contact between the base and the inner edge of the disc, said surface having a radius of curvature which permits the base to contact the inner edge of the disc with at least two contact points when the disc is supported in the groove, said sidewalls and base being constructed to support the disc with an inner edge region of the disc supported against said face.

12. The mandrel of claim 11, which further includes a sensing system, including light-producing and light-receiving fiber elements, extending through said bar for detecting light-reflecting objects near the mandrel along the axis thereof.

* * * * *